United States Patent
Hung

(10) Patent No.: US 8,982,622 B2
(45) Date of Patent: Mar. 17, 2015

(54) 3D MEMORY ARRAY WITH READ BIT LINE SHIELDING

(71) Applicant: Macronix International Co., Ltd., Hsinchu (TW)

(72) Inventor: Shuo-Nan Hung, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/066,450

(22) Filed: Oct. 29, 2013

(65) Prior Publication Data

US 2014/0056072 A1     Feb. 27, 2014

Related U.S. Application Data

(63) Continuation of application No. 13/345,526, filed on Jan. 6, 2012, now Pat. No. 8,587,998.

(51) Int. Cl.
*G11C 16/04* (2006.01)
*H01L 27/115* (2006.01)
*H01L 23/522* (2006.01)

(52) U.S. Cl.
CPC ............ *G11C 16/04* (2013.01); *G11C 16/0483* (2013.01); *H01L 27/11578* (2013.01); *H01L 23/5225* (2013.01)
USPC ............ 365/185.05; 365/189.11; 365/185.11; 365/185.02; 365/189.16

(58) Field of Classification Search
CPC ...... G11C 8/04; G11C 16/0483; G11C 11/16; G11C 11/405; G11C 11/4076; G11C 11/5607; G11C 11/5628
USPC ............. 365/185.05, 189.11, 185.02, 185.19, 365/185.11, 189.16
See application file for complete search history.

(56) References Cited

U.S. PATENT DOCUMENTS

| 6,034,882 A | 3/2000 | Johnson et al. |
| 6,906,361 B2 | 6/2005 | Zhang |

(Continued)

FOREIGN PATENT DOCUMENTS

| EP | 1936681 A1 | 6/2008 |
| EP | 2048709 A2 | 4/2009 |

OTHER PUBLICATIONS

Soon-Moon Jung et al. "Three Dimensionally Stacked NAND Flash Memory Technology Using Stacking Single Crystal Si Layers on ILD and TANOSStructure for Beyond 30nm Node," Electron Devices Meeting, 2006, IEDM Internatinal, Dec. 11-13, 2006, pp. 1-4.

(Continued)

Primary Examiner — Thong Q Le
(74) Attorney, Agent, or Firm — James F. Hann; Haynes Beffel & Wolfeld LLP

(57) ABSTRACT

A memory device includes a block of memory cells having a plurality of levels. Each level includes strips of memory cells extending in a first direction between first and second ends of the block. A first bit line structure, at each level at the first end, is coupled to a first string of memory cells extending from the first end. A second bit line structure, at each level at the second end, is coupled to a second string of memory cells extending from said second end. Bit line pairs extend in the first direction with each including odd and even bit lines. Odd and even bit line connectors connect the odd and even bit lines to the second and first bit line structures, respectively. Each bit line for a series of bit line pairs are separated by a bit line of an adjacent pair of bit lines.

18 Claims, 12 Drawing Sheets

(56) References Cited

U.S. PATENT DOCUMENTS

| | | |
|---|---|---|
| 6,906,940 B1 | 6/2005 | Lue |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 8,503,213 B2 | 8/2013 | Chen et al. |
| 8,587,998 B2 | 11/2013 | Hung |
| 2005/0280061 A1 | 12/2005 | Lee |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2010/0109065 A1* | 5/2010 | Oh et al. .................. 257/314 |
| 2010/0270593 A1 | 10/2010 | Lung et al. |
| 2010/0322000 A1 | 12/2010 | Shim et al. |

OTHER PUBLICATIONS

Jiyoung Kim et al., Novel 3-D Structure for Ultra High Density Flash Memory with VRAT (Vertical-Recess-Array-Transistor) and PIPE (Planarized Integration on the same PlanE), 2008 Symposium on VLSI Technology Digest of Technical Papers, pp. 122-123.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) NAND-Type Flash Memory," 2006 IEEE, pp. 1-4.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-Channel FinFET BE-SONOS NAND Flash with Improved Memory Window and Cycling Endurance," 2009 Symposium on VLSI Technology Digest of Technical Papers, pp. 224-225.

Wonjoo Kim et al. "Multi-Layered Vertical Gate NAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Yoshiaki Fukuzumi et al. "Optimal Integration and Characteristics of Vertical Array Devices for Ultra-High Density, Bit-Cost Scalable Flash Memory," IEEE 2007, pp. 449-452.

Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

* cited by examiner

| Group | Metal Bit-line | | | | | | | | | | | | | | | | SSL | |
|---|---|---|---|---|---|---|---|---|---|---|---|---|---|---|---|---|---|---|
| | 8E | 7E | 8O | 7O | 6E | 5E | 6O | 5O | 4E | 3E | 4O | 3O | 2E | 1E | 2O | 1O | Even | Odd |
| 1 | R | S | R | S | R | S | R | S | R | S | R | S | R | S | R | S | SSL0 | SSL1 |
| 2 | S | R | S | R | S | R | S | R | S | R | S | R | S | R | S | R | SSL0 | SSL1 |
| 3 | R | S | R | S | R | S | R | S | R | S | R | S | R | S | R | S | SSL2 | SSL3 |
| 4 | S | R | S | R | S | R | S | R | S | R | S | R | S | R | S | R | SSL2 | SSL3 |
| 5 | R | S | R | S | R | S | R | S | R | S | R | S | R | S | R | S | SSL4 | SSL5 |
| 6 | S | R | S | R | S | R | S | R | S | R | S | R | S | R | S | R | SSL4 | SSL5 |
| 7 | R | S | R | S | R | S | R | S | R | S | R | S | R | S | R | S | SSL6 | SSL7 |
| 8 | S | R | S | R | S | R | S | R | S | R | S | R | S | R | S | R | SSL6 | SSL7 |
| 9 | R | S | R | S | R | S | R | S | R | S | R | S | R | S | R | S | SSL8 | SSL9 |
| 10 | S | R | S | R | S | R | S | R | S | R | S | R | S | R | S | R | SSL8 | SSL9 |
| 11 | R | S | R | S | R | S | R | S | R | S | R | S | R | S | R | S | SSL10 | SSL11 |
| 12 | S | R | S | R | S | R | S | R | S | R | S | R | S | R | S | R | SSL10 | SSL11 |
| 13 | R | S | R | S | R | S | R | S | R | S | R | S | R | S | R | S | SSL12 | SSL13 |
| 14 | S | R | S | R | S | R | S | R | S | R | S | R | S | R | S | R | SSL12 | SSL13 |
| 15 | R | S | R | S | R | S | R | S | R | S | R | S | R | S | R | S | SSL14 | SSL15 |
| 16 | S | R | S | R | S | R | S | R | S | R | S | R | S | R | S | R | SSL14 | SSL15 |

| Group | Metal Bit-line | | | | | | | | | | | | | | | | SSL | |
|---|---|---|---|---|---|---|---|---|---|---|---|---|---|---|---|---|---|---|
| | 8E | 7E | 8O | 7O | 6E | 5E | 6O | 5O | 4E | 3E | 4O | 3O | 2E | 1E | 2O | 1O | Even | Odd |
| 1 | R | S | R | S | R | S | R | S | R | S | R | S | R | S | R | S | SSL0 | SSL9 |
| 2 | S | R | S | R | S | R | S | R | S | R | S | R | S | R | S | R | SSL0 | SSL9 |
| 3 | R | S | R | S | R | S | R | S | R | S | R | S | R | S | R | S | SSL2 | SSL11 |
| 4 | S | R | S | R | S | R | S | R | S | R | S | R | S | R | S | R | SSL2 | SSL11 |
| 5 | R | S | R | S | R | S | R | S | R | S | R | S | R | S | R | S | SSL4 | SSL13 |
| 6 | S | R | S | R | S | R | S | R | S | R | S | R | S | R | S | R | SSL4 | SSL13 |
| 7 | R | S | R | S | R | S | R | S | R | S | R | S | R | S | R | S | SSL6 | SSL15 |
| 8 | S | R | S | R | S | R | S | R | S | R | S | R | S | R | S | R | SSL6 | SSL15 |
| 9 | R | S | R | S | R | S | R | S | R | S | R | S | R | S | R | S | SSL8 | SSL1 |
| 10 | S | R | S | R | S | R | S | R | S | R | S | R | S | R | S | R | SSL8 | SSL1 |
| 11 | R | S | R | S | R | S | R | S | R | S | R | S | R | S | R | S | SSL10 | SSL3 |
| 12 | S | R | S | R | S | R | S | R | S | R | S | R | S | R | S | R | SSL10 | SSL3 |
| 13 | R | S | R | S | R | S | R | S | R | S | R | S | R | S | R | S | SSL12 | SSL5 |
| 14 | S | R | S | R | S | R | S | R | S | R | S | R | S | R | S | R | SSL12 | SSL5 |
| 15 | R | S | R | S | R | S | R | S | R | S | R | S | R | S | R | S | SSL14 | SSL7 |
| 16 | S | R | S | R | S | R | S | R | S | R | S | R | S | R | S | R | SSL14 | SSL7 |

# 3D MEMORY ARRAY WITH READ BIT LINE SHIELDING

CROSS-REFERENCE TO RELATED APPLICATIONS

This application is a continuation of U.S. patent application Ser. No. 13/345,526 entitled "3D MEMORY ARRAY WITH READ BIT LINE SHIELDING" filed 6 Jan. 2012, now U.S. Pat. No. 8,587,998, which application is incorporated herein by reference.

BACKGROUND OF THE INVENTION

1. Field of the Invention

The present technology relates to high density memory devices, such as memory devices in which multiple levels of memory cells are arranged to provide a three-dimensional (3D) array.

2. Description of Related Art

Critical dimensions of devices in integrated circuits are shrinking to the limits of common memory cell technologies. In one trend to achieve high density, designers have been looking to techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple levels of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

SUMMARY OF THE INVENTION

Techniques are described herein for reducing the capacitive coupling loading between adjacent global bit lines and adjacent bit line structures.

A first example of a memory device includes a block of memory cells having a plurality of levels. Each level includes strips of memory cells extending in a first direction between first and second ends of the block of memory cells. A first bit line structure is at each level at the first end of the block of memory cells. Each first bit line structure is operably coupled to a first string of memory cells extending from the first end. A second bit line structure is at each level at the second end of the block of memory cells. Each second bit line structure is operably coupled to a second string of memory cells extending from said second end. A plurality of bit line pairs, extending in the first direction, includes at least first, second and third bit line pairs, each bit line pair includes an odd bit line and an even bit line. Odd bit line conductors connect the odd bit lines to the second bit line structures. Even bit line conductors connect the even bit lines to the first bit line structures. Each bit line for a series of bit line pairs are separated by a bit line of an adjacent pair of bit lines.

In some examples of the first memory cell example, the odd bit line for a second bit line pair is located between the odd and even bit lines for a first bit line pair, the even bit line for the first bit line pair is located between the odd and even bit lines for the second bit line pair, and the even bit line for the second bit line pair is located between the even bit line for the first bit line pair and the odd bit line for a third bit line pair, whereby capacitive coupling between bit lines can be reduced when odd bit line pairs are read separately from even bit line pairs. In some examples, every other odd bit line conductor in a series of odd bit line conductors comprises a laterally offset portion, and every other even bit line conductor in a series of even bit line conductors comprises a laterally offset portion.

In some examples of the first memory cell example, the first and second bit line structures are operably coupled to the first and second strings of memory cells by string select switches. Some examples include a plurality of word lines and sets of first and second string select lines; the word lines in the plurality of word lines being arranged to select a corresponding plane of memory cells in the plurality of levels orthogonal to the strings of memory cells, the set of first string select lines being arranged to select string select switches connecting corresponding strings in the strings of memory cells to the first bit line structures in the plurality of levels, and the set of second string select lines being arranged to select string select switches connecting corresponding strings in the strings of memory cells to the second bit line structures.

A second example of a memory device includes block of memory cells having a plurality of levels, each level has strips of memory cells extending in a first direction between first and second ends of the block of memory cells. Bit line structures are at each level at the first and second ends of the block of memory cells. Each bit line structure is operably coupled to a string of memory cells. A plurality of pairs of bit lines extend in the first direction and include a series of at least first, second, third and fourth bit line pairs. The bit lines have ends overlying the bit line structures at both of the first and second ends of the block of memory cells. Bit line conductors at a first end of the block of memory cells connect the second and fourth bit line pairs to the first bit line structures. A bit line conductor for the second bit line pair has a laterally offset portion extending generally beneath the first bit line pair. A bit line conductor for the fourth bit line pair has a laterally offset portion extending generally beneath the third bit line pair.

In some examples of the second memory cell example, bit line conductors are at the second end of the block of memory cells connecting the first and third pairs of bit lines to the second bit line structures. Some examples further include a bit line conductor at the second end of the block of memory cells for the first pair of bit lines, the bit line conductor having a laterally offset portion extending generally beneath the second pair of bit lines, and a bit line conductor at the second end of the block of memory cells for the third pair of bit lines, such bit line conductor having a laterally offset portion extending generally beneath the fourth pair of bit lines. In some examples, the bit line conductors for the second and fourth pairs of bit lines are connected to bit line structures at different levels.

Another aspect of the invention is directed to a method for selecting local bit lines of a memory device. The local bit lines include a set of even local bit lines operably coupled to first bit line structures at a plurality of levels at a first end of the memory device, and a set of odd local bit lines operably coupled to second bit line structures at the plurality of levels at a second end of the memory device. According to this method an even local bit line is selected. An odd the local bit line is selected. The selecting steps are carried out so that the selected local bit lines are not adjacent to one another. In some examples, the even local bit line selecting step comprises choosing from among at least the following ordered even local bit lines: BL0, BL2, BL4, BL6, BL8, BL10, BL12, BL14; the odd local bit line selecting step comprises choosing from among at least the following ordered odd local bit lines: BL1, BL3, BL5, BL7, BL9, BL11, BL13, BL15; and the local bit lines are arranged in the following order: BL0, BL1, BL2, BL3, BL4, BL5, BL6, BL7, BL8, BL9, BL10, BL11, BL12, BL13, BL14, BL15. In some examples, the selecting steps are carried out to select even local bit line BL0 and odd local bit line BL9. Other features, aspects and advantages of the present invention can be seen on review the figures, the detailed description, and the claims which follow.

BRIEF DESCRIPTION OF THE DRAWINGS

FIG. 9 is a table showing 16 different groups or ways of applying read signals to every other global bit line using different pairs of adjacent string select switches.

FIG. 10 is a table similar to that of FIG. 9 but in which the pairs of string select switches are not adjacent to one another as in FIG. 8 but are widely spaced apart while achieving the same pattern of read signal application.

DETAILED DESCRIPTION

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows.

Figure 1:
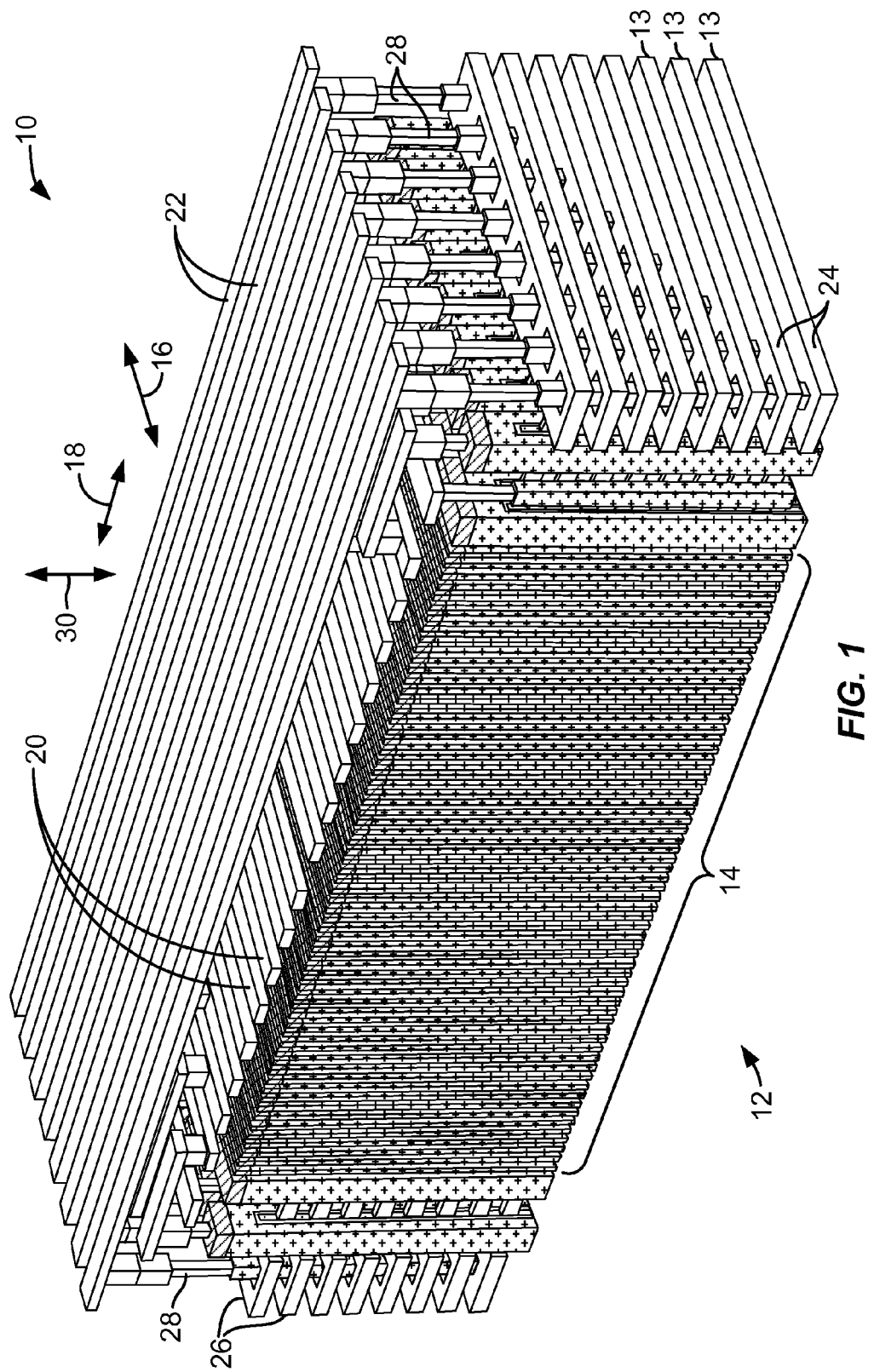
FIG. 1 is a simplified 3-D diagram of a 3-D memory device.
Figure 2:
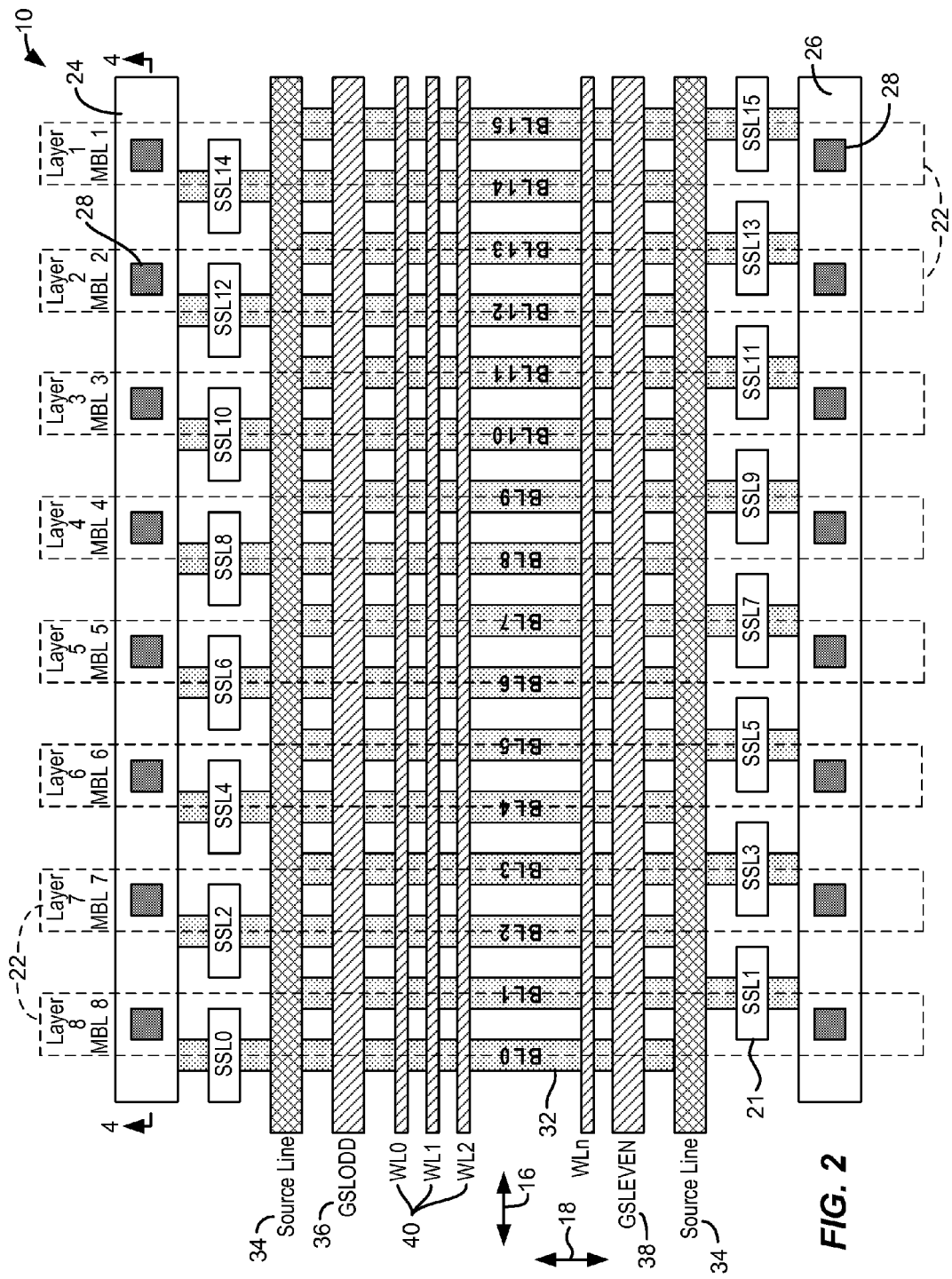
FIG. 2 is a schematic diagram of a portion of the structure of FIG. 1.

FIGS. 1 and 2 illustrate a 3-D memory device 10 including a block 12 of memory cells, the individual memory cells not shown. 3-D memory device 10 is similar to that shown in U.S. patent application Ser. No. 13/078,311, filed on 1 Apr. 2011 and entitled Memory Architecture of Third Array with Alternating Memory String Orientation and String Select Structures. Block 12 of memory cells includes a number of levels 13, eight levels 13 being shown in FIG. 1. Each level 13 include strings of memory cells. Memory device 10 also includes a series of word lines 14. Word lines 14 extend in a first direction 16 and the strings of memory cells extend in a second direction 18. String select lines 20 extend in the first direction 16 and are electrically connected to selected ones of the strings of memory cells via string select switches 21 located at ends of the strings. The string select lines 20 in this configuration are connected to stacks of string select switches 21, one on each level, so that an SSL line signal selects a stack of lines, not just one line. String select switches 21 are typically transistors and are shown in FIG. 2. Memory device 10 also includes global bit lines 22, sometimes designated in the figures as metal bit lines MBL, which extend in second direction 18, coupled to first and second bit line structures 24, 26, sometimes referred to as bit line pads, at each level 13 by bit line plugs 28. First and second bit line structures 24, 26 are arranged one on top of one another in a third direction 30 and are positioned at the first and second ends of block 12 of the memory cells. Thus, memory cells at each level 13 have a first bit line structure 24 at the first end connected to the memory cells, and a second bit line structure 26 at the second end connected to the memory cells. As shown, eight global bit lines 22 are used with eight levels 13 of bit line structures 24, 26.

Memory device 10 also includes local bit lines 32, shown in FIG. 2, within block 12 of the memory cells extending in second direction 18. It is seen that there are two local bit lines 32 for each global bit line 22. Memory device 10 includes other features including source lines 34, ground select lines odd 36, ground select lines even 38 and word lines 40, all extending in first direction 16.

Figure 3:
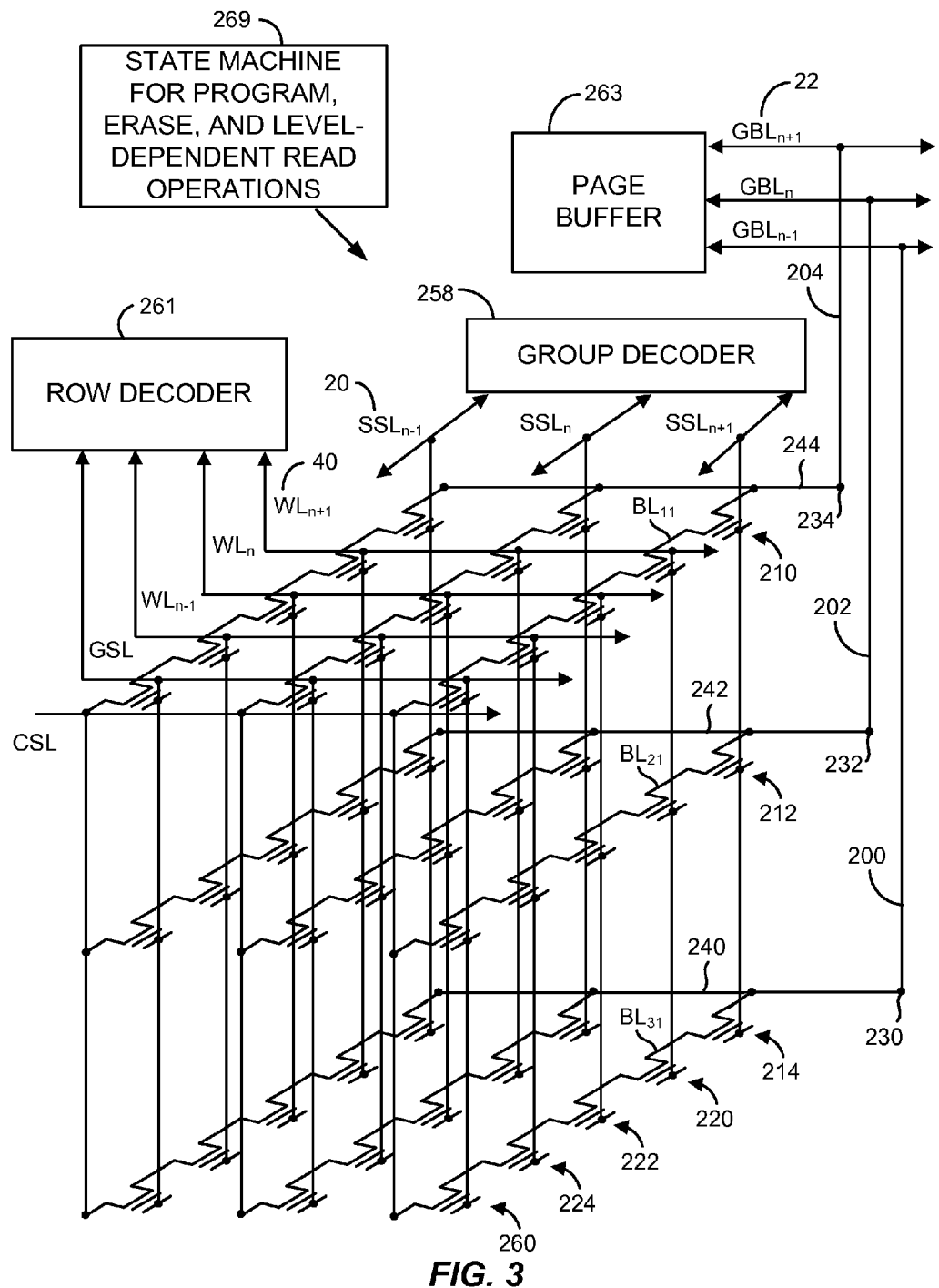
FIG. 3 is a schematic diagram of a portion of a memory array used to illustrate the three levels of memory cells of a block of memory cells.

FIG. 3 is a schematic diagram of a portion of an example of a 3D NAND flash memory array used to illustrate three levels of memory cells, which is representative of a block of memory cells that can include many levels.

A plurality of word lines including word lines WLn−1, WLn, WLn+1 extend in parallel along first direction 16. The word lines are in electrical communication with row decoder 261. The word lines are connected to the gates of the memory cells, which are arranged in series as NAND strings. Word line WLn is representative of the word lines. As shown in FIG. 2, the word line WLn is vertically connected to the gates of the memory cells in each of the various levels underlying the word line WLn.

A plurality of local bit lines is arranged along columns to form NAND strings in the various levels of the memory array. The array includes a local bit line BL31 on the third level, a local bit line BL21 on the second level, and local bit line BL11 on the first level. The memory cells have dielectric charge trapping structures between the corresponding word lines and the corresponding local bit lines. In this illustration, there are three memory cells in a NAND string for simplicity. For example, a NAND string formed by local bit line BL31 on the third level comprises memory cells 220, 222, 224. In a typical implementation, a NAND string may comprise 16, 32 or more memory cells.

A plurality of string select lines including string select lines SSLn−1, SS1n, SS1n+1 (20) are in electrical communication with group decoder 258 (which could be part of the row decoder 261), which selects a group of strings. The string select lines are connected to the gates of string select transistors arranged at the first ends of the memory cell NAND strings. Each of the string select lines is vertically connected to the gates of a column of the string select transistors in each of the various levels. For example, string select line SSLn+1 is connected to the gates of string select transistors 210, 212, 214 (21) in the three levels.

The local bit lines on a particular level are selectively coupled to an extension on the particular level by the corresponding string select transistors. For example, the local bit lines on the third level are selectively coupled to extension 240 by the corresponding string select transistors in that level. Similarly, the local bit lines on the second level are selectively coupled to extension 242, and local bit lines on the first level are selectively coupled to extension 244.

The extensions on each of the levels include a corresponding contact pad for contact with a vertical conductor coupled to a corresponding global bit line. For example, extension 240 in the third level is coupled to a global bit line GBLn−1 via contact pad 230 and vertical connector 200. Extension 242 on the second level is coupled to a global bit line GBLn via contact pad 232 and vertical connector 202. Extension 244 on the third level is coupled to a global bit line GBLn+1.

The global bit lines GBLn−1, GBLn, and GBLn+1 (22) are coupled to additional blocks (not shown) in the array and extend to page buffer 263. In this manner a 3D decoding network is established, in which a page of selected memory cells is accessed using one word line, all or some of the bit lines and one string select line.

Block select transistors are arranged at the second ends of the NAND strings. For example, block select transistor 260 is arranged at the second end of the NAND string formed by memory cells 220, 222, 224. A ground select line GSL is connected to the gates of the block select transistors. The ground select line GSL is in electrical communication with the row decoder 261 to receive bias voltages during operations.

The block select transistors are used to selectively couple second ends of all the NAND strings in the block to a reference voltage provided on common source line CSL. The common source line CSL receives bias voltages from the bias circuit (not shown here) during operations. In some operations, the CSL is biased to a reference voltage that is higher than that of a bit line coupled to the opposite end of a NAND string, rather than in the more traditional "source" role at or near ground.

Figure 4:
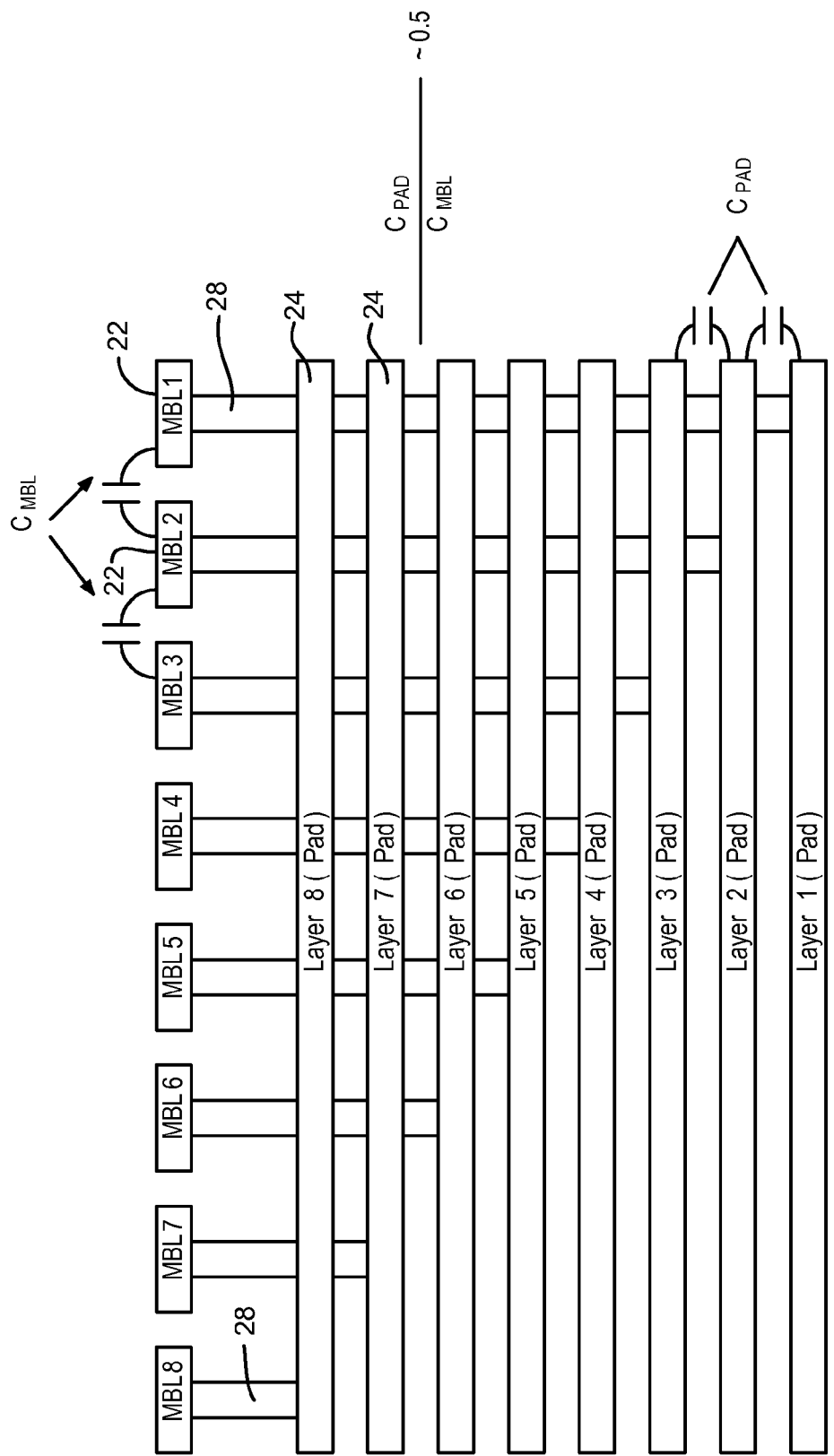
FIG. 4 is a schematic diagram of a portion of the structure of FIG. 2 taken along line 4-4 in FIG. 2.

The major bit-line loading of some 3-D memory devices, such as device 10 of FIGS. 1 and 2, are illustrated in FIG. 4. That is, the major bit-line loading is from both the adjacent global bit lines and the adjacent bit-line pads. The adjacent global bit lines 22 results in global bit line capacitive coupling, indicated by $C_{MBL}$ in FIG. 4, and bit line structure (sometimes referred to as bit line pad) capacitive coupling, indicated by $C_{PAD}$ in the figure. It is estimated that for the layout of the example of FIGS. 1 and 2, about ⅔ of the capacitive coupling loading comes from adjacent global bit lines 22 while about ⅓ of the capacitive coupling loading comes from adjacent bit line structures 24, 26 (bit line pads).

The drawback of the 3-D memory structure of the prior art is that the read throughput is reduced because of the need to shield the adjacent bit line coupling effect. In each read, either even or odd global bit lines are read. The adjacent global bit lines serve a shielding purpose. In this kind of the memory structure, only ¼ of the bit lines are accessed in one read operation.

Figure 5:
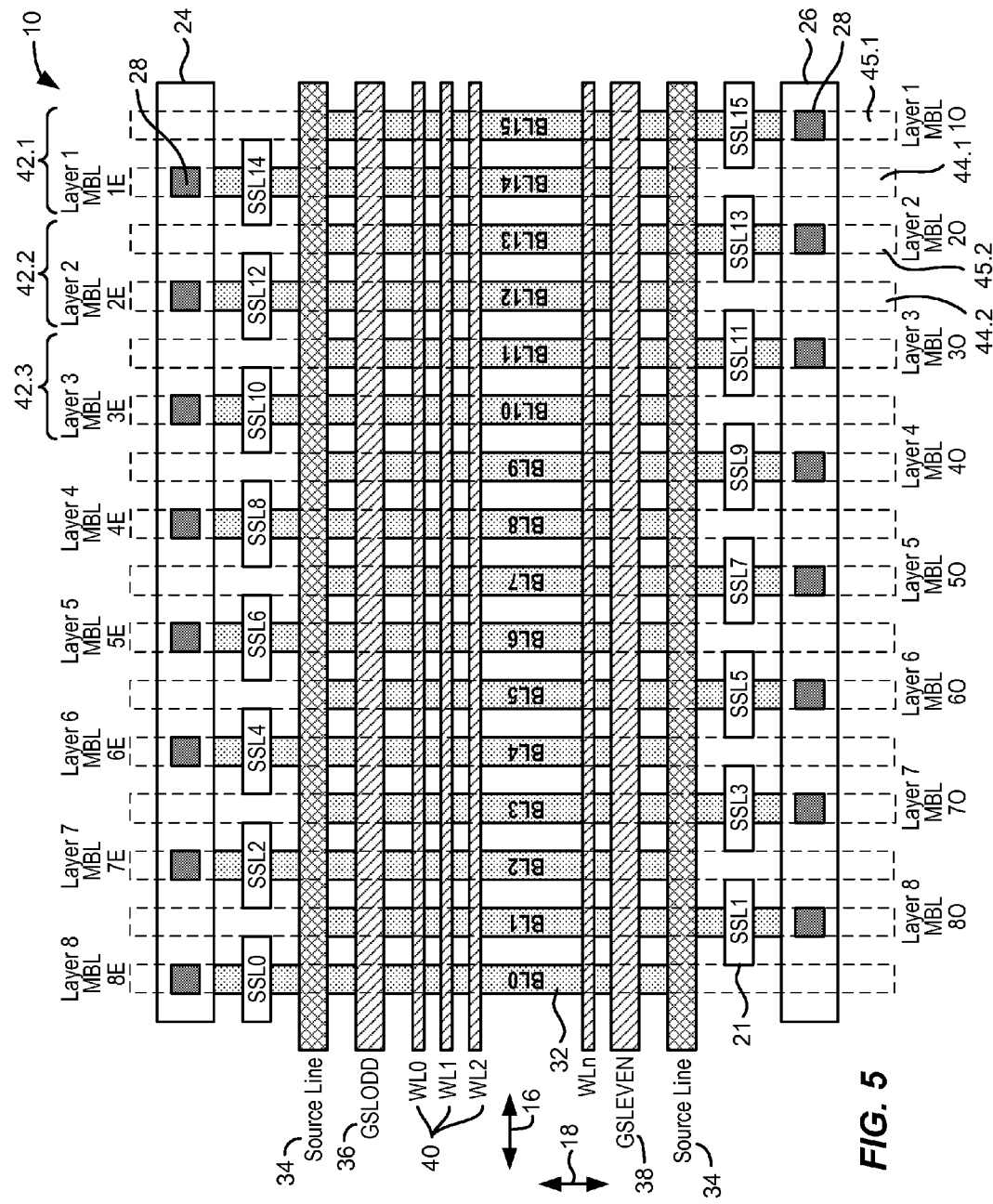
FIG. 5 is a schematic diagram of a 3-D memory device similar to that of FIG. 2 in which the 3-D memory device of FIG. 1 has been modified to address the problem of global bit line capacitive coupling.

FIG. 5 shows one example of a 3-D memory device 10 constructed to improve the read throughput such as present with the structure of FIGS. 1, 2 and 4. One half of the bit lines are accessed in each read. Note that like elements are referred to with like reference numerals.

In this example, there are 16 stacks of local bit lines, so that there are 16 local bit lines 32, identified in FIG. 5 as BL0-BL15 in the illustrated block on each level. There are eight levels corresponding to the eight bit line plugs 28. First bit line structures 24 are top level bit line structures; there are eight, one for each level. Each of the eight bit line plugs 28 at the first end is connected to a first bit line structure 24 on a different level. Similarly, each of the eight bit line plugs 28 at the second end is connected to a second bit line structure 26 on a different level.

The FIG. 5 example is similar to the 3-D memory device 10 of FIGS. 1, 2 and 4 but has 16 global bit lines 22 instead of the 8 global bit lines 22 of FIGS. 1, 2 and 4. In this example, there are eight pairs 42 of global bit lines 22. Note that a series of a particular structure, such as pairs 42 of global bit lines 22, may be identified with successive decimal reference numerals such as pair 42.1, pair 42.2, etc. To reduce the capacitive coupling, a pair 42 of global bit lines 22 is used for each level. The two global bit lines are identified in the figure as MBL 1O (metal/global bit line 1 odd), MBL 1E (metal/global bit line 1 even), MBL 2O, MBL 2E, etc. and will be referred to as first bit lines (even) 44 and second bit lines (odd) 45. The first bit lines 44 are connected to first bit line structures 24 by bit line plugs 28 and are identified as even because they are connected to a bit line structure coupled to the even string select switches 21, identified as SSL0, SSL2, through SSL14. Similarly, the global bit lines 45 are connected to the second bit line structures 26 and are identified as odd because they are connected to bit line structure coupled to the odd string select switches 21, identified as SSL1, SSL3, through SSL15. While this structure addresses the significant problem of global bit line capacitive coupling $C_{MBL}$, it does not to reduce the bit line pad (bit line structure) capacitive coupling, $C_{PAD}$.

Figure 6:
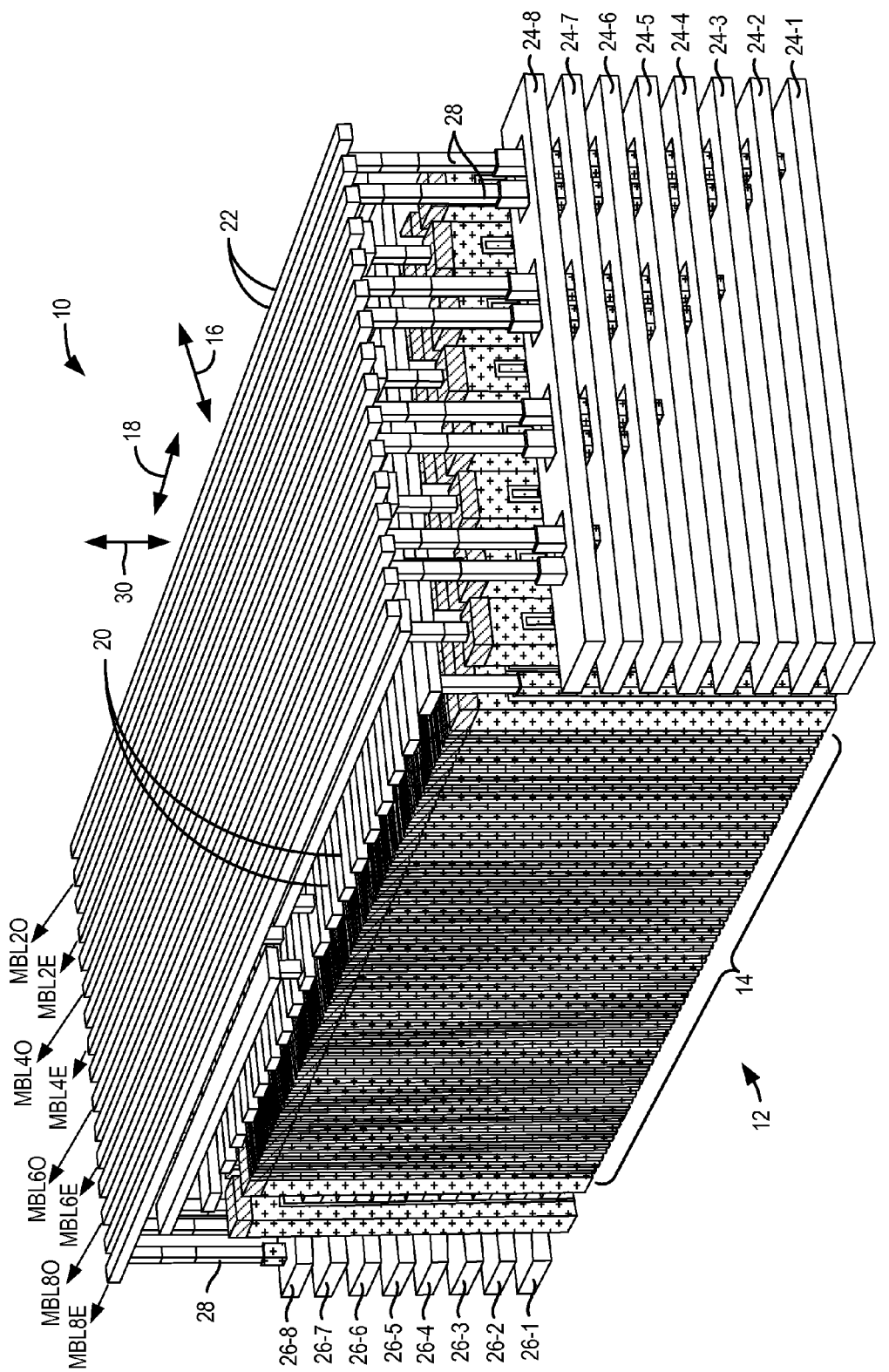
FIG. 6 is a 3-D diagram of a 3-D memory device similar to that of FIG. 1 modified to address both the problem of global bit line capacitive coupling and the problem of bit line pad, also called a bit line structure, capacitive coupling.
Figure 7:
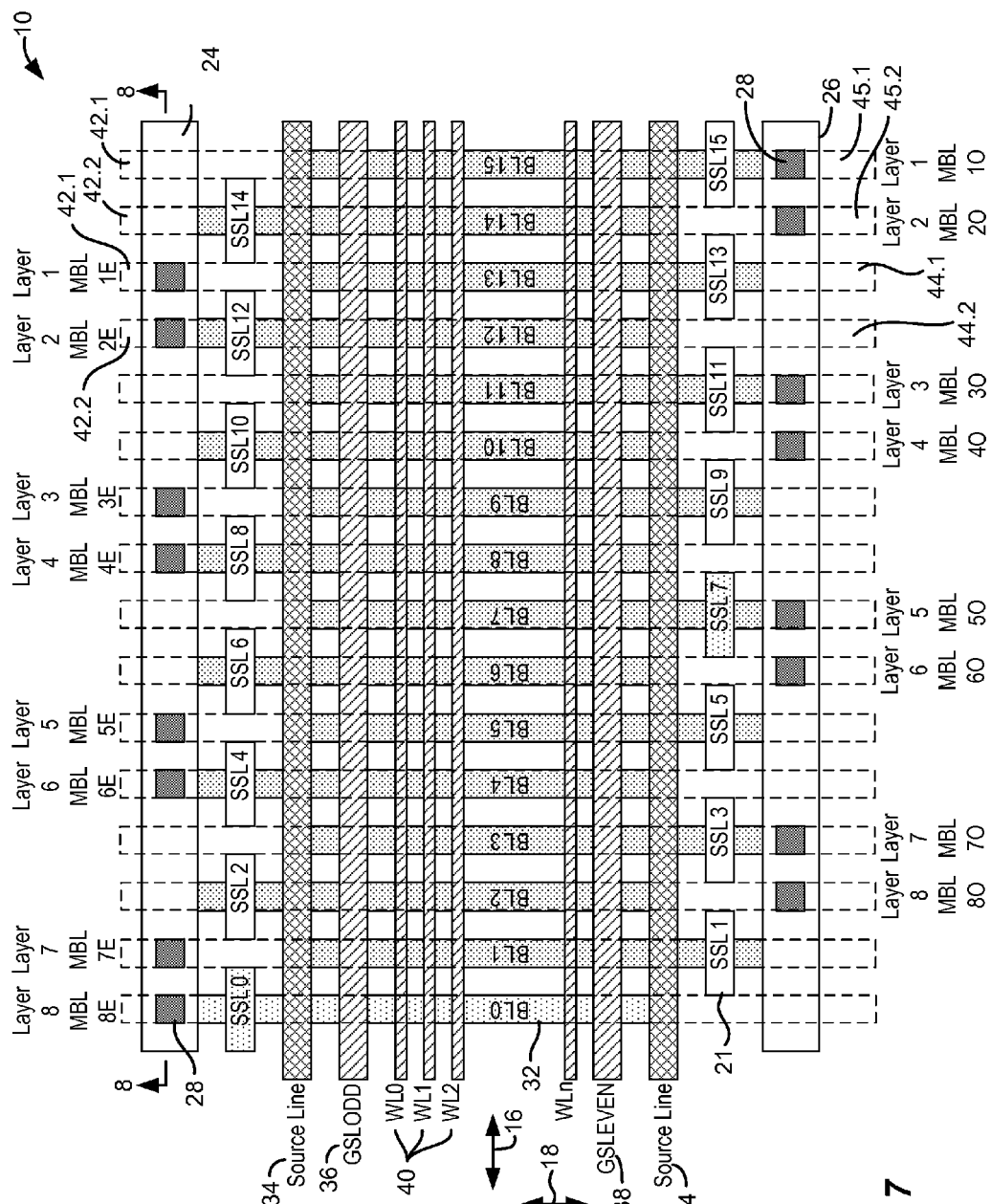
FIG. 7 is a schematic diagram of a portion of the device of FIG. 6.
Figure 8:
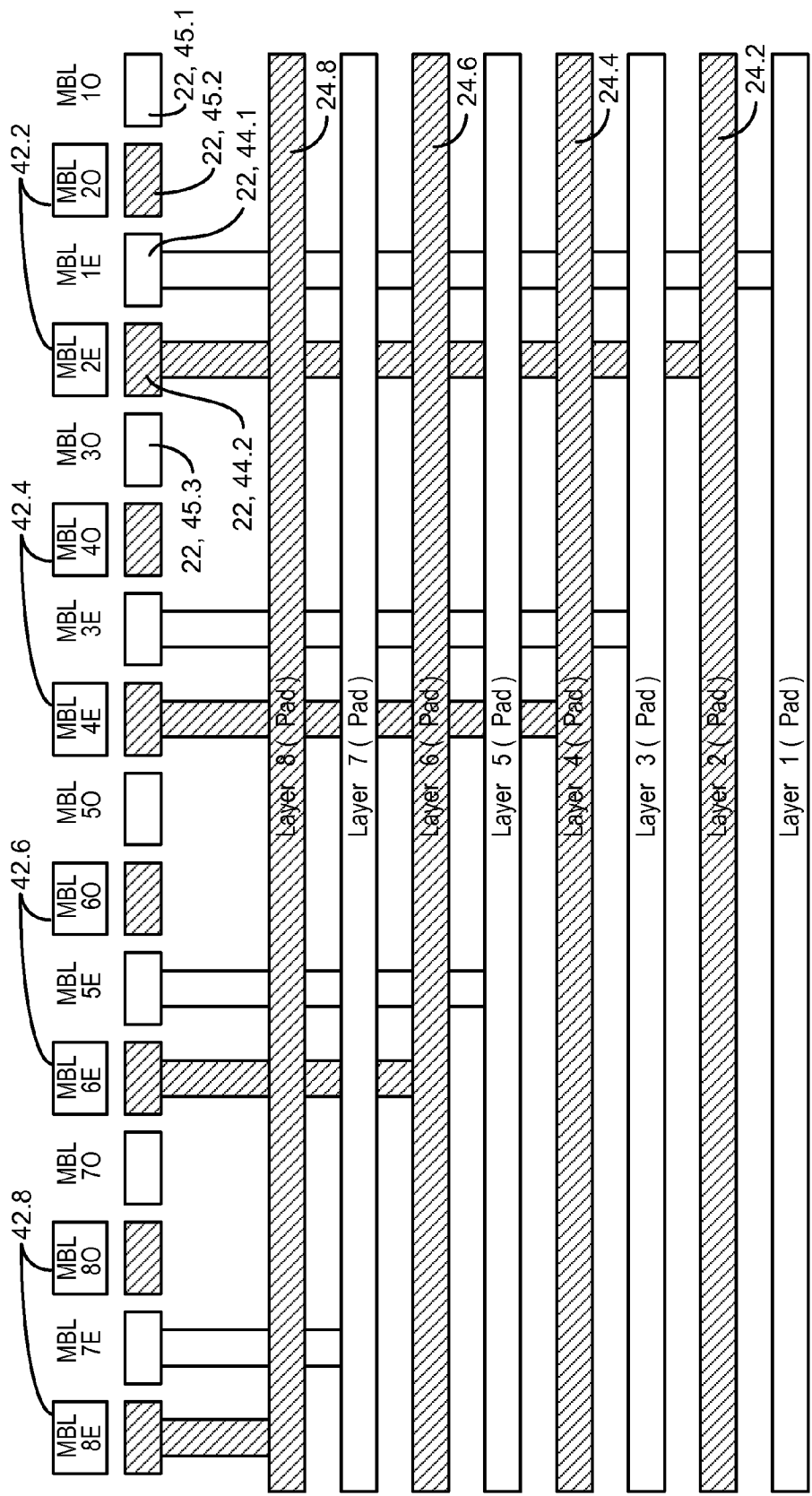
FIG. 8 is a schematic diagram of a portion of the structure of FIG. 7 taken along line 8-8 of FIG. 7 illustrating reading of every other bit line structure while providing capacitive isolation between adjacent global bit lines and between adjacent bit line structures.

To improve the read throughput and shield the loading from both the adjacent global bit-lines and the adjacent bit-line pads, a new 3-D memory structure is proposed. FIGS. 6, 7 and 8 are figures similar to FIGS. 1, 2 and 4 of a 3-D memory device 10 but have 16 global bit lines 22 instead of the 8 global bit lines 22 of FIGS. 1, 2 and 4 and which addresses the problem of both global bit line capacitive coupling $C_{MBL}$ and pad bit line structure capacitive coupling, $C_{PAD}$. As with the example of FIG. 5, odd global bit line 45 of each bit line pair 42 is connected to a second bit line structure 26 and even global bit line 44 of each bit line pair 42 is connected to the first bit line structure 24, the bit line structures 24, 26 being at the same level. However, the odd and even global bit lines 45, 44 for each bit line pair 42 are separated by a bit line of the adjacent bit line pair 42. For example, odd bit line 45.1 for the first bit line pair 42.1 is separated from even bit line 44.1 of the first bit line pair 42.1 by the odd bit line 45.2 of the second bit line pair 42.2; odd bit line 45.2 of the second bit line pair 42.2 is separated from the even bit line 44.2 of the second bit line pair 42.2 by the even bit line 44.1 of the first bit line pair 42.1; etc.

FIG. 8 is a simplified cross-sectional view taken along line 8-8 of FIG. 7. In this figure it is assumed that the second bit line pair 42.2, the fourth bit line pair 42.4, the sixth bit line pair 42.6 and the eighth bit line pair 42.8 are being read or otherwise accessed in parallel, that is, substantially simultaneously, as indicated by the crosshatching. This ability to read in parallel, which can be considered a page mode read, enables very fast read times to be achieved. The layers of second bit line structures 26 accessed by the bit line pairs are also crosshatched and identified as second bit line structures 26.2, 26.4, 26.6 and 26.8. Note that each bit line structure 26 is being accessed by both odd and even bit lines 45, 44. However, the separation of odd and even bit lines 45, 44 for each bit line pair 42 by a bit line of an adjacent bit line pair helps to reduce bit line capacitive coupling while permitting effectively simultaneous access to every other bit line structure in each stack of bit line structures. Similarly, accessing every other bit line structure in each of the stacks of bit line structures permits the interpositioned bit line structures to reduce capacitive coupling effects.

FIG. 9 is a table showing 16 different groups or ways of applying read signals to every other global bit line using different pairs of adjacent string select switches. In FIG. 9, R stands for "read status", that is the global bit-line is selected for read so that the status is ON, while S stands for "shield status" so that the global bit-line is used for shielding purpose so that the status is OFF. For example, group 1 uses SSL0 and SSL1 as the even and odd string select lines 21, BL0 and BL1 are selected; group 3 uses SSL2 and SSL3 as the even and odd string select lines 21, BL2 and BL3 are selected; etc. The results for the odd numbered groups, such as group 1 and group 3 are the same while the results for the even number groups are also the same but are opposite the results for the odd number groups. FIG. 10 shows another alternative of this SSL arrangement, and this alternative can reduce the coupling effect from neighbor local bit-line, such as coupling effect between BL0 and BL1. FIG. 10 is a table similar to that of FIG. 9 but in which the pairs of string select switches are not the adjacent to one another as in FIG. 8 but are widely spaced apart while achieving the same pattern of read signal application. For example, group 1 uses SSL0 and SSL9 as the even and odd string select lines 21, BL0 and BL9 are selected. The coupling effect between adjacent bit-lines is eliminated.

Figure 12:
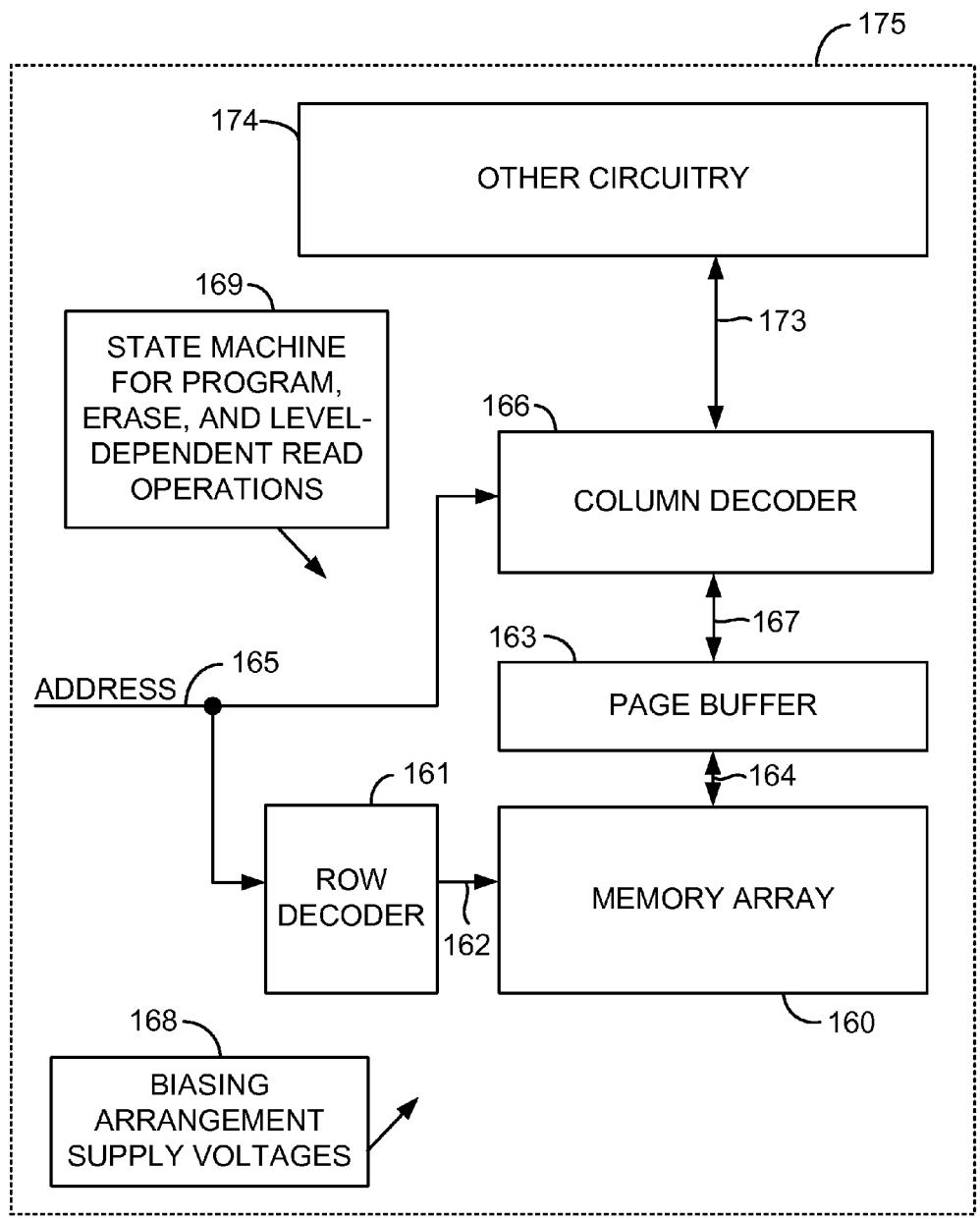
FIG. 12 is a simplified block diagram of an integrated circuit including block of memory cells, typically referred to as a memory array.

The tables of FIGS. 9 and 10 specify the logic implementations for the SSL and level decoding that selects columns. The ability to use different pairs of string select switches 21 gives flexibility in the layout of decoders, decoders 161, 166 discussed below with reference to FIG. 12. This flexibility can be used to help achieve the best performance for a particular 3D layout. In the FIG. 10 example, the decoding makes sure that no adjacent SSL transistor stacks are selected during a parallel read. Column decode block 166 of FIG. 12 is preferably arranged to provide the flexibility needed to permit the use of a wide range of string select lines as exemplified by FIGS. 9 and 10.

Figure 11:
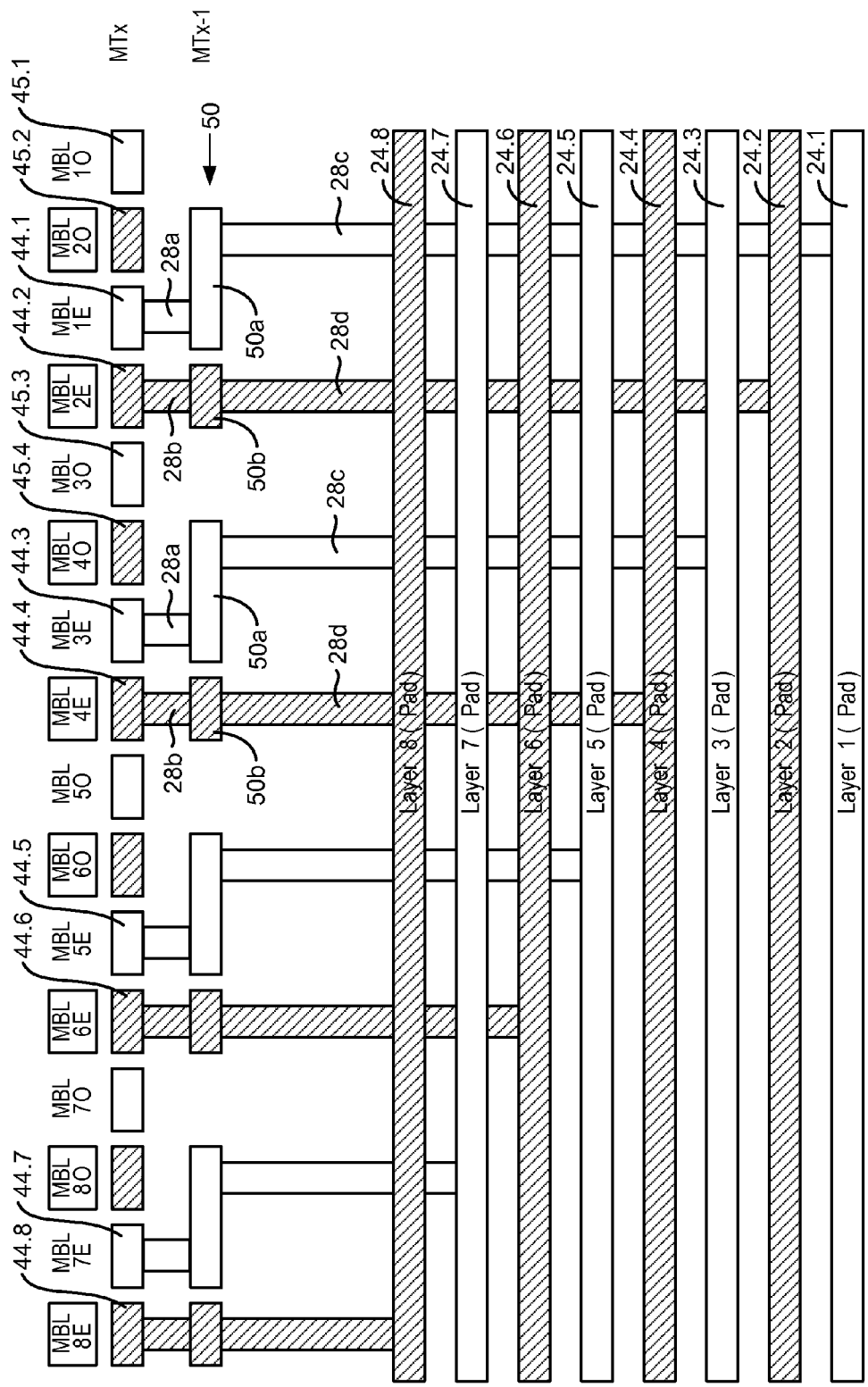
FIG. 11 is another example of a 3-D memory device which addresses both the problem of global bit line capacitive coupling and the problem of bit line pad capacitive coupling.

FIG. 11 shows another alternative example which also addresses the problem of both global bit line capacitive coupling $C_{MBL}$ and pad bit line structure capacitive coupling, $C_{PAD}$. The FIG. 11 example is similar to the FIGS. 6, 7 and 8 example but instead of having a bit line plugs 28 extend straight down to the bit line structures 24, 26, an additional conductive layer 50 below the layer of global bit lines 22 is used to laterally offset one of the two bit line plugs 28 for each bit line pair 42.

In the FIG. 11 example, an upper bit line plug section 28A extends downwardly from even bit line 44.1 where it intersects offset additional conductive layer section 50A. A lower, offset bit line plug section 28C extends downwardly from offset section 50A to connect with first bit line structure 24.1. The lateral offset provided by offset section 50A directs offset plug section 28C downwardly beneath odd bit line 45.2. Similar upper plug sections 28A, offset sections 50A and offset plug sections 28C extend from even bit lines 44.3, 44.5 and 44.7. An upper bit line section 28B extends downwardly from even bit line 44.2 to connect with an aligned additional bit line structure 50B. A lower, aligned bit line plug structure 28D extend straight down from aligned section 50B to connect with the second bit line structure 24.2. Similar upper plug sections 28D, aligned sections 50A and aligned plug sections 28D extend from even bit lines 44.4, 44.6 and 44.8. A similar arrangement of aligned and offset plug structures extend from the odd bit lines 45 at the other end of the structure.

The FIG. 11 arrangement takes advantage of the even/odd arrangement as to the location of the bit line plugs on alternating bit line structures. That is, at one end of the structure the bit line plugs extending from every other even bit line 44 to the first bit line structures 24 can be offset to underlie an adjacent odd bit line 45. This permits the use of larger vias, or more space between the vias, or both, when constructing the lower bit line plug sections 28C, 28D. Similarly, at the other end the bit line plugs extending from every other odd bit line 45 to the second bit line structures 26 can be offset to underlie an adjacent even bit line 44, to the same advantages.

As in FIG. 8, it is assumed that the second bit line pair 42.2, the fourth bit line pair 42.4, the sixth bit line pair 42.6 and the eighth bit line pair 42.8 are being read or otherwise accessed in parallel, that is, substantially simultaneously, as indicated by the crosshatching. Unlike the FIG. 5 example, the FIG. 11 example not only reduces global bit line capacitive coupling, it also reduces bit line pad (bit line structure) capacitive coupling, $C_{PAD}$.

FIG. 12 is a simplified block diagram of an integrated circuit 175 including block 12 of memory cells, typically referred to as memory array 160, which can function as described herein. As discussed above, the array 160 includes multiple levels of memory cells. A row decoder 161 is coupled to a plurality of word lines 162 (14) arranged along rows, that is in first direction 16, in the memory array 160. Column decoders in block 166 are coupled to a set of page buffers 163, in this example, via data bus 167. The global bit lines 164 (22) are coupled to local bit lines (not shown) arranged along columns, that is in second direction 18, in the memory array 160. Addresses are supplied on bus 165 to column decoder (block 166) and row decoder (block 161). Data is supplied via the data-in line 173 from other circuitry 174 (including, for example, input/output ports) on the integrated circuit, such as a general purpose processor or special purpose application circuitry, or a combination of modules providing system-on-a-chip functionality supported by the array 160. Data is supplied via the line 173 to input/output ports or to other data destinations internal or external to the integrated circuit 175.

A controller, implemented in this example as a state machine 169, provides signals to control the application of bias arrangement supply voltages generated or provided through the voltage supply or supplies in block 168 to carry out the various operations described herein. These operations include erase, program and level-dependent read with different read bias conditions for each level of the array 160. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level or highest threshold level, as suits a designer. Further, the term "write" as used herein describes an operation which changes the threshold voltage of a memory cell, and is intended to encompass both program and erase.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

Any and all patents, patent applications and printed publications referred to above are incorporated by reference.

What is claimed is:

1. A memory device, comprising:
   a first stack of N pads in a block of memory cells, each pad in the first stack connected to respective levels of the block of memory cells;
   a first set of N interlayer conductors in contact with landing areas on corresponding pads in the first stack; and
   2N interconnect conductors over the block, including a first set of N interconnect conductors in contact with respective ones of said first set of N interlayer conductors, and a second set of interconnect conductors, the first set of N interconnect conductors including N/2 pairs of adjacent interconnect conductors separated by 2 adjacent interconnect conductors in the second set.

2. The memory device according to claim 1, wherein:
   the first stack of pads comprises a first stack of bit line structures; and
   the first stack of bit line structures comprises an upper first bit line structure, a lower first bit line structure and intermediate first set of pads therebetween.

3. The memory device according to claim 2, wherein the first set of interlayer conductors comprise:
   an upper first interlayer conductor, which contacts the upper first bit line structure;
   a lower first interlayer conductor, which contacts the lower first bit line structure; and
   intermediate first interlayer conductors, which contact the intermediate first bit line structures.

4. The memory device according to claim 3, wherein the upper first bit line structure and the intermediate first bit line structures have openings through which the lower first interlayer conductor and the intermediate first interlayer conductors pass.

5. The memory device according to claim 1, wherein the first set of interlayer conductors comprises alternating first and second types of interlayer conductors, the first type of interlayer conductors having laterally offset portions.

6. The memory device according to claim 1, wherein the pads are bit line structures.

7. The memory device according to claim 1, wherein a plurality of the pads have openings for the passage of interlayer conductors therethrough.

8. The memory device of claim 1, including:
   a second stack of N pads in the block of memory cells, each pad in the second stack connected to respective levels of the block of memory cells;
   a second set of N interlayer conductors in contact with landing areas on corresponding pads in the second stack; and
   wherein the second set of N interconnect conductors being in contact with respective ones of said second set of N interlayer conductors, and including N/2 pairs of adjacent interconnect conductors separated by 2 adjacent interconnect conductors in the first set.

9. The memory device according to claim 8, wherein the first and second interlayer conductors comprise bit line plugs.

10. The memory device according to claim 8, wherein the first interlayer conductors contact pads at each level of the block of memory cells and the second interlayer conductors contact pads at each level of the block of memory cells.

11. The memory device according to claim 8, wherein:
    the second stack of pads comprises a second stack of second bit line structures;
    the second stack of bit line structures comprises an upper second bit line structure, a lower second bit line structure and intermediate second bit line structures therebetween;
    the second set of interlayer conductors comprise:
       an upper second interlayer conductor, which contacts the upper second bit line structure;
       a lower second interlayer conductor, which contacts the lower second bit line structure; and
       intermediate second interlayer conductors, which contact the intermediate second bit line structures;
    the upper second bit line structure and the intermediate second bit line structures have openings through which the lower second interlayer conductor and the intermediate second interlayer conductors pass.

12. The memory device according to claim 11, wherein the first and second set of pads are operably coupled to the memory cells by string select switches.

13. A memory device comprising:
    a block of memory cells comprising a plurality of levels, each level comprising strips of memory cells extending in a first direction between first and second ends of the block of memory cells;
    a first bit line pad at each level at the first end of the block of memory cells, each first bit line pad operably coupled to a first string of memory cells extending from said first end;
    a second bit line pad at each level at the second end of the block of memory cells, each second bit line pad operably coupled to a second string of memory cells extending from said second end;
    a plurality of bit line pairs extending in the first direction comprising at least first and second bit line pairs, each bit line pair comprising an odd bit line and an even bit line;
    the odd bit lines connected to the second bit line pads;
    the even bit lines connected to the first bit line pads;
    each bit line for a series of bit line pairs being separated by a bit line of an adjacent pair of bit lines;
    first interlayer conductors, aligned with the even bit lines, extending to and contacting first bit line pads to create a first staircase arrangement of contact locations on the first bit line pads; and
    second interlayer conductors, aligned with the odd bit lines, extending to and contacting second bit line pads to create a second staircase arrangement of contact locations on the second bit line pads.

14. The memory device according to claim 13, wherein:
the first bit line pads comprising a first stack of second bit line pads;
the first stack of bit line pads comprises an upper first bit line pad, a lower first bit line pad and intermediate first bit line pads therebetween;
the first interlayer conductors comprise:
- an upper first interlayer conductor, which contacts the upper first bit line pad;
- a lower first interlayer conductor, which contacts the lower first bit line pad; and
- intermediate first interlayer conductors, which contact the intermediate first bit line pads;

the upper first bit line pads and the intermediate first bit line pads have openings through which the lower first interlayer conductor and the intermediate first interlayer conductors pass.

15. The memory device according to claim 14, wherein:
the second bit line pads comprising a second stack of second bit line pads;
the second stack of bit line pads comprises an upper second bit line pad, a lower second bit line pad and intermediate second bit line pads therebetween;
the second interlayer conductors comprise:
- an upper second interlayer conductor, which contacts the upper second bit line pad;
- a lower second interlayer conductor, which contacts the lower second bit line pad; and
- intermediate second interlayer conductors, which contact the intermediate second bit line pads;

the upper second bit line pads and the intermediate second bit line pads have openings through which the lower second interlayer conductor and the intermediate second interlayer conductors pass.

16. The memory device according to claim 13, wherein:
the plurality of bit line pairs including a series of at least first, second and third bit line pairs; and further comprising:
bit line conductors at a first end of the block of memory cells connecting the second bit line pairs to the first bit line pads; and wherein:
a bit line conductor for a chosen one of the second bit line pairs has a laterally offset portion extending generally beneath the first bit line pair.

17. The memory device according to claim 16, further comprising bit line conductors at the second end of the block of memory cells connecting the first and third bit line pairs to the second bit line pads.

18. The memory device according to claim 17, wherein:
the series of bit line pairs further comprises a fourth bit line pair; the bit line conductor at the second end of the block of memory cells for the first bit line pair having a laterally offset portion extending generally beneath the second bit line pair; and
the bit line conductor at the second end of the block of memory cells for the third bit line pair having a laterally offset portion extending generally beneath the fourth bit line pair.

* * * * *